United States Patent
Zhang

(10) Patent No.: US 8,090,061 B1
(45) Date of Patent: Jan. 3, 2012

(54) AGC CONTROL FOR MIMO SYSTEMS

(75) Inventor: Ning Zhang, Saratoga, CA (US)

(73) Assignee: Qualcomm Atheros, Inc., San Jose, CA (US)

( * ) Notice: Subject to any disclaimer, the term of this patent is extended or adjusted under 35 U.S.C. 154(b) by 784 days.

(21) Appl. No.: 12/031,617

(22) Filed: Feb. 14, 2008

Related U.S. Application Data

(60) Provisional application No. 60/891,930, filed on Feb. 27, 2007.

(51) Int. Cl.
*H04L 27/08* (2006.01)

(52) U.S. Cl. .......................................... 375/345

(58) Field of Classification Search .................. 375/267, 375/299, 347, 349; 330/129, 130, 131, 133, 330/254; 455/234.1, 234.2, 236.1, 239.1, 455/240.1, 241.1, 245.1, 245.2, 246.1, 247.1, 455/250.1, 251.1, 101, 132–141; 700/53
See application file for complete search history.

(56) References Cited

U.S. PATENT DOCUMENTS

2006/0270364 A1* 11/2006 Aoki .............................. 455/101
2007/0025478 A1*  2/2007 Koga ............................. 375/345

* cited by examiner

*Primary Examiner* — Sam K Ahn
(74) *Attorney, Agent, or Firm* — Bever, Hoffman & Harms, LLP

(57) ABSTRACT

An AGC control unit coordinates AGC gain changes between individual receive chains included within a MIMO receiver block. Coordinated AGC gain changes reduce time periods of unaligned MIMO data produced by the receive chains. Reducing the unaligned data periods advantageously increases the time that the output data may be combined to improve overall performance of the receiver block. Coordinated AGC control also enables a faster response to saturated signals since the gain of multiple receive chains may be changed contemporaneously.

20 Claims, 4 Drawing Sheets

AGC CONTROL FOR MIMO SYSTEMS

RELATED APPLICATIONS

This application claims priority of U.S. Provisional Patent Application 60/891,930, entitled "AGC Control For MIMO Systems" filed Feb. 27, 2007.

BACKGROUND OF THE INVENTION

1. Field of the Invention

The present invention relates to a multiple-input-multiple-output (MIMO) receiver block and in particular to a coordinated automatic gain control (AGC) for such a MIMO receiver block.

2. Related Art

Multiple-input-multiple-output (MIMO) wireless LAN architectures can provide improved performance when compared to single-input-single output architectures. This improved performance may be provided by, in part, using two or more receivers to receive transmitted data.

A typical receiver block for MIMO systems uses multiple input receivers (also called receive chains). FIG. 1 is a block diagram of a prior art MIMO receiver block 100 that includes a first receive chain 110A and a second receive chain 110B. Note that other prior art embodiments may include more than two receive chains.

In this embodiment, first receive chain 110A includes an antenna 101A, an analog front end (AFE) 102A, an analog to digital converter (ADC) 103A, an automatic gain controller (AGC) 104A, and a digital signal processing (DSP) block 106A within a DSP unit 105. Transmitted data in the form of an RF signal is received by antenna 101A and is processed within AFE 102A. Specifically, the RF signal is transformed into a baseband analog signal within AFE 102A. To provide this processing, AFE 102A may include one or more variable gain amplifiers (VGAs) (e.g. a VGA 107A).

AFE 102A provides the transformed RF signal, i.e. the baseband analog signal, to ADC 103A. In turn, ADC 103A converts this baseband analog signal into a digital signal. ADC 103A provides this digital signal to DSP block 106A of DSP unit 105. DSP block 106A may perform further signal processing upon the digital signal to, for example, demodulate or improve the signal quality of the received signal. In some embodiments, DSP unit 105 can use information from more than one DSP block, which is described in greater detail below.

Note that the digital signal generated by ADC 103A is also provided to AGC 104A. AGC 104A can monitor the output of ADC 103A and change the gain of VGA 107A within AFE 102A. The gain of VGA 107A may be changed, for example, to maximize the signal to noise ratio (SNR) of the received signal. For example, if the processed signal produced by AFE 102A is too large, then ADC 103A may saturate and cause distortion of the received signal. In this example, AGC 104A would detect this condition and reduce the gain of AFE 102A using VGA 107A. On the other hand, if the processed signal produced by AFE 102A is too small, then the circuit noise of AFE 102A and ADC 103A may significantly degrade the received signal. In this example, AGC 104A would detect this condition and increase the gain of AFE 102A using VGA 107A. AGC 104A may also change the gain of VGA 107A during the training sequences that are transmitted along with the transmitted data as outlined by, for example, the IEEE 802.11a, 802.11g, or (draft) 802.11n standards. Note that the components of second receive chain 110B are generally similar to those of first receive chain 110A in structure and operation (e.g. AGC 104A is substantially the same as AGC 104B).

As shown in FIG. 1, although second receive chain 110B may be substantially independent of first receive chain 110A, there may be one or more structures common to receive chains 110A/110B within receiver block 100, e.g. DSP unit 105. DSP unit 105 may use information from DSP blocks 106A and 106B to improve demodulation or other aspects of the signal processing of the signals within receive chains 110A and 110B.

The output data of a receive chain may become invalid (i.e. produce invalid data) when the setting of a VGA within an AFE is changed. Typically, a gain change within the AFE needs time to propagate and the processing elements of the receive chain need time to react to the gain change and to settle. This propagation and settling period is often referred to more generically as settling time. Because the operation of the processing elements may be changing during the settling time, the data produced by the receive chain may be uncertain (i.e. the data produced is invalid data). Therefore, after the gain is changed in an AFE, the ADC outputs may be invalid until the settling time has past. If the data produced by the one or more receive chains is invalid, the MIMO (i.e. the combined) data is said to be unaligned.

One advantage of a MIMO receiver block (e.g. receiver block 100) is that the output data from the two or more receive chains may be combined and used to increase the overall performance of the receiver block. In some cases, the data combining process requires that the receive chains produce aligned MIMO data (i.e. produce valid data at substantially the same time). Conversely, if one or more of the receive chains within the receiver block produces invalid data, the data combining process may fail and the overall performance of the receiver block may be impaired.

FIG. 2 is a graph illustrating an example of the output data timing relationship between receive chains 110A and 110B of receiver block 100 (FIG. 1). The top line of data in the graph illustrates the timing of the output data from receive (Rx) chain 110A and the middle line of data in the graph illustrates the timing of the output data from Rx chain 110B. As shown, at time $t=t_0$, Rx chain 110A is producing valid data. For this example, assume that AGC 104A determines that a gain change greater than some threshold should be applied to VGA 107A and thus changes the gain of VGA 107A at time $t=t_1$. This gain change causes the output data of Rx chain 110A to become invalid beginning at time $t=t_2$. The invalid data is typically produced for a period as long as the settling time of AFE 102A. After the settling time of AFE 102A, the output data of Rx chain 110A is again valid as shown in FIG. 2 at time $t=t_3$.

Because receive chains 110A and 110B operate independently, AGC 104B of Rx chain 110B may change the gain of VGA 107B independently of gain changes applied to VGA 107A. Returning to the example, at time $t=t_r$, assume that Rx chain 110B produces valid data as shown in FIG. 2. At time $t=t_8$, AGC 104B changes the gain of VGA 107B and the output data of Rx chain 110B may be invalid beginning at time $t=t_8$. The invalid data may be produced for a period as long as the settling time of AFE 102B. After the settling time of AFE 102B, the output of Rx chain 110B is again valid as shown in FIG. 2 at time $t=t_7$.

Because AGCs 104A and 104B can operate independently, the MIMO data produced by combining data from receive (Rx) chains 110A and 110B can become unaligned. One such period 201 is shown in the bottom line of data in the graph of FIG. 2. Other periods of unaligned MIMO data exist within FIG. 2 (for example, including those periods where both receiver chains produce invalid data), but are not annotated for clarity. As previously described, unaligned MIMO data can undesirably reduce receiver block performance.

Contrasting with unaligned data, periods of aligned data exist when the outputs of the receive chains within the receiver block produce valid data at approximately the same time. Stated another way, aligned MIMO data may be considered to be the logical AND of valid data from the receive chains. For example, referring to the bottom line of the graph in FIG. 2, the time period between $t=t$, through $t=t_8$ illustrates a period 202 of aligned MIMO data. Other periods of aligned MIMO data are also shown on FIG. 2, but have not been annotated for clarity.

Another method that may be used to set the gains of the receive chains is based on the AGC setting of a single chain. This method assumes that the gain settings for all receive chains in the receiver block are similar. Therefore, the same gain setting may be applied to all VGAs within all the receive chains. Because the same gain setting is applied to all of the VGAs, the AGC controller only needs to determine a single gain setting and cause all of the AGCs to change their respective gains contemporaneously.

While this method may address the problem of unaligned data, the method may provide sub-optimal performance of the receiver block. It is often the case that the signal strength of the received signals may vary substantially from receive chain to receive chain. For example, it is not uncommon for the signal strength to differ by more than 10 dB between two receive chains. Therefore setting the gain of the VGAs to similar levels may provide optimal gain for one particular receive chain, but provide too much or too little gain for other receive chains.

As the foregoing illustrates, there is a need to provide per-chain automatic gain control in a MIMO receiver block while coordinating gain adjustments to maximize aligned data.

SUMMARY OF THE INVENTION

A multiple-input multiple-output (MIMO) receiver block can advantageously combine data from multiple receiver chains to improve system performance. To provide this improvement in one embodiment, the MIMO receiver block can provide coordination of the gain changes in the multiple receive chains. Notably, the coordination provides only two data generation modes: one mode in which all receive chains simultaneously produce valid data and another mode in which all receive chains simultaneously produce invalid data.

To provide the system improvements in another embodiment, the MIMO receiver block can determine a specific gain change for each receive chain. Then, when a non-zero gain change is determined for one receive chain, the MIMO receiver block can trigger simultaneous gain changes in the multiple receive chains using the specific gain changes. In one embodiment, at least one specific gain change is zero. In another embodiment, at least one specific gain change is less than a predetermined threshold set for the non-zero gain change. In yet another embodiment, the predetermined threshold is programmed. In yet another embodiment, the amount of gain change in a receive chain other than the one receive chain is approximately the same as a gain change of the one receive chain plus/minus a pre-determined non-zero offset.

To provide the system improvements in yet another embodiment, the MIMO receiver block can trigger a gain change simultaneously in all receive chains in the MIMO receiver block when a predetermined gain change is indicated for one receive chain in the MIMO receiver block. Notably, the MIMO receiver block can provide an individually-determined gain change for each receive chain.

In the MIMO receiver block, each receive chain can include an analog front end (AFE), an analog-to-digital converter (ADC), a digital signal processing (DSP) block, and an automatic gain controller (AGC). The AFE, which includes a variable gain amplifier (VGA), can transform a received RF signal into a baseband signal. The ADC can convert the baseband signal into a digital signal. The DSP block can perform signal processing of the digital signal. The AGC can monitor the digital signal, determine a gain change in response to the monitoring, and provide the gain change to the VGA. In one embodiment, the AFE and/or the DSP block can further provide signal quality data to the AGC.

Notably, the MIMO receiver block can further include an AGC control unit for providing coordination of gain changes in the multiple receive chains. This coordination can provide only two data generation modes: a first data generation mode in which the multiple receive chains simultaneously produce valid data and a second data generation mode in which the multiple receive chains simultaneously produce invalid data. In one embodiment, the AGC control unit can determine a specific gain change for each receive chain, and when a non-zero gain change is determined for one receive chain, trigger simultaneous gain changes in the multiple receive chains using the specific gain changes.

DETAILED DESCRIPTION OF THE DRAWINGS

A MIMO receiver can advantageously combine data from multiple receiver chains to improve system performance. Some conventional MIMO receivers apply gain adjustments at different times in the receiver chains. These gain adjustments can result in valid data being generated by one receiver chain and invalid data being simultaneously generated by another receiver chain. The simultaneous generation of valid data and invalid data prevents successful data combination (i.e. produces unaligned MIMO data), thereby undesirably degrading MIMO receiver performance. Other conventional MIMO receivers apply the same gain adjustment to all receiver chains at the same time to remedy the MIMO data alignment problem. However, because the appropriate gains for the receiver chains can vary, this gain adjustment also results in sub-optimal system performance.

Figure 3:
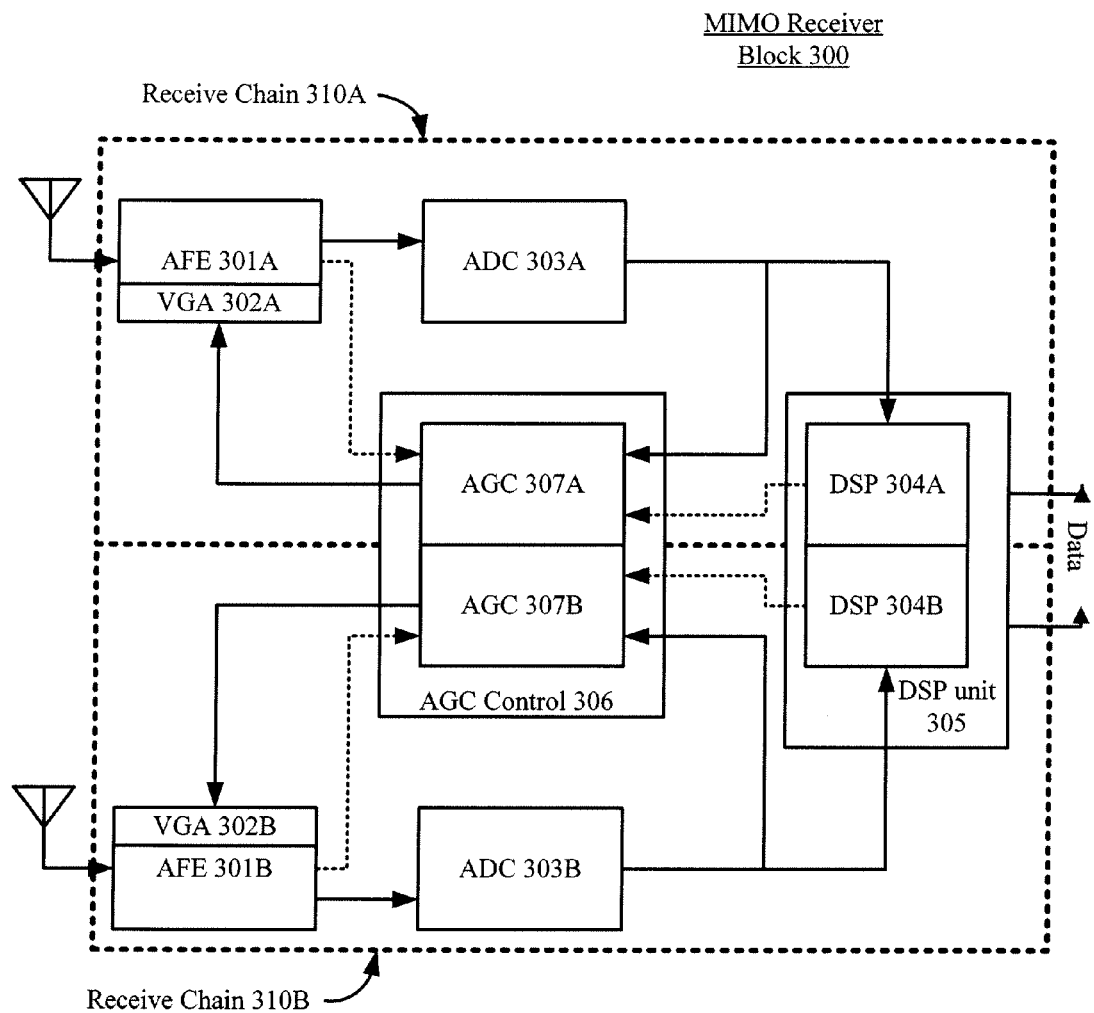
FIG. 3 is a block diagram of an exemplary MIMO receiver block that includes per-chain AGCs.

FIG. 3 illustrates an exemplary MIMO receiver block 300 that can coordinate a tailored gain adjustment of all receiver chains, thereby providing optimized system performance. In this embodiment, MIMO receiver block 300 includes two receive chains 310A and 310B. Note that other receiver block embodiments may include three or more receive chains. Receiver chain 310A can include an AFE 301A, an ADC 303A, a DSP 304A, and an AGC 307A. Similarly, receiver chain 310B can include an AFE 301B, an ADC 303B, a DSP 304B, and an AGC 307B. DSP blocks 304A and 304B are included in a DSP unit 305 that is shared between multiple receive chains. The functioning of these individual components is substantially the same as that described above for standard components and therefore is not repeated herein.

Note that as used herein, a reference number without an alpha generically refers to a component or a plurality of those components. For example, receiver chain 310 generically refers to receive chain 310A or receive chain 310B, whereas receiver chains 310 generically refer to receive chains 310A and 310B.

Notably, receiver block 300 can include an AGC control unit 306 that is shared between multiple receive chains, e.g. receive chains 310A and 310B. AGC control unit 306 can advantageously coordinate gain changes such that when a gain change greater than some threshold is required for any particular receive chain 310 in MIMO receiver block 300 (also called a triggering receive chain), AGC control unit 306 can initiate a gain change in all of the receive chains 310 within MIMO receiver block 300 at substantially the same time. Moreover, AGC control unit 306 can advantageously tailor a gain change for each receive chain 310. Thus, in some cases, the gain change effected in other than the triggering chain may be less than a threshold amount or even no change at all.

Because the gains of all receive chains 310 are changed contemporaneously and the settling time of the AFEs 301 is substantially the same, the resulting MIMO data consist only of valid data in all receive chains 310 or invalid data in all receive chains 310 at any point in time. Specifically, by changing the gains of VGAs 302 of all receive chains 310 at substantially the same time, invalid data caused by the gain change is produced by all receive chains 310 at substantially the same time, i.e. during the settling time of AFEs 301. In contrast, in other than the settling time, valid data is produced at substantially the same time on all receive chains 310.

Figure 4:
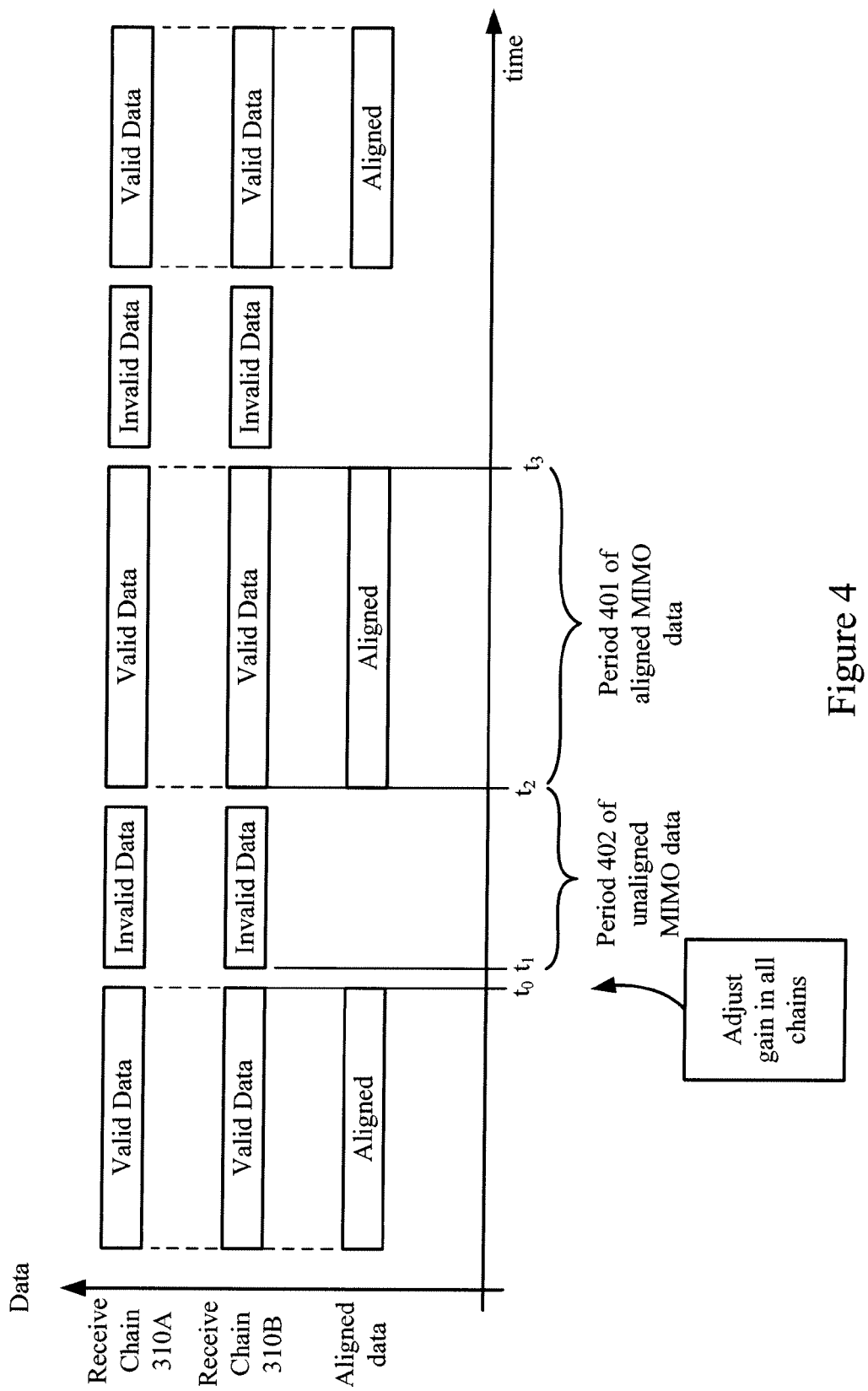
FIG. 4 is a graph illustrating an example of the output data timing relationship between the receive chains of FIG. 3.

FIG. 4 illustrates an exemplary output data timing relationship between receive chains 310A and 310B of MIMO receiver block 300 of FIG. 3. The top line of the graph illustrates the timing of the output data for receive chain 310A and the middle line of the graph illustrates the timing of the output data for receive chain 310B. In FIG. 3, assume that at time t=$t_o$ AGC 307A determines that the gain of VGA 302A should be increased by a predetermined amount, e.g. 5 dB. Also at the same time, AGC 307B determines that no gain change (i.e. a gain change equal to zero) needs to be made to VGA 302B.

In this case, at time t=$t_o$, AGC control unit 306 triggers a gain change of 5 dB through AGC 307A and a gain change of 0 dB through AGC 307B. As the changes are applied to VGA 302A and VGA 302B, the resulting output data from receive chains 310A and 310B become invalid at time t=$t_1$. The invalid data period typically lasts as long as the settling time required by AFEs 301A and 301B (which are substantially the same). At time t=$t_2$, the settling time ends and, therefore, receive chains 310A and 310B again produce valid data.

As shown in FIG. 4, receiver block 300 of FIG. 3 can advantageously ensure that either all receive chains 310 simultaneously produce valid data (e.g. period 401 of aligned MIMO data) or all receive chains 310 simultaneously produce invalid data (e.g. period 402 of unaligned MIMO data). In other words, receiver block 300 provides only two data generation modes: a first data generation mode in which all receive chains 310 simultaneously produce valid data and a second data generation mode in which all receive chains 310 simultaneously produce invalid data.

As previously described, AGC control unit 306 is triggered to make gain changes by at least one receive chain that requires a non-zero gain change. Additionally, AGC control unit 306 can advantageously apply specific gain changes on all receive chains 310 at the same time. In one embodiment, the functions of AGC 307A and AGC 307B may be combined with AGC control unit 306.

Improved Operation During Saturation

Consider an exemplary case when a very large RF signal is received by a receive chain such that the receive chain is saturated and, therefore, the output data is distorted. One method to quickly determine the receive chain saturation is to examine the digital data produced by the ADC. If the digital data samples contain the extremes of the output range of the ADC, a saturation condition may exist. Because this method examines the output of the ADC directly rather than after processing by the DSP, the saturation condition may be detected quickly.

Figure 1:
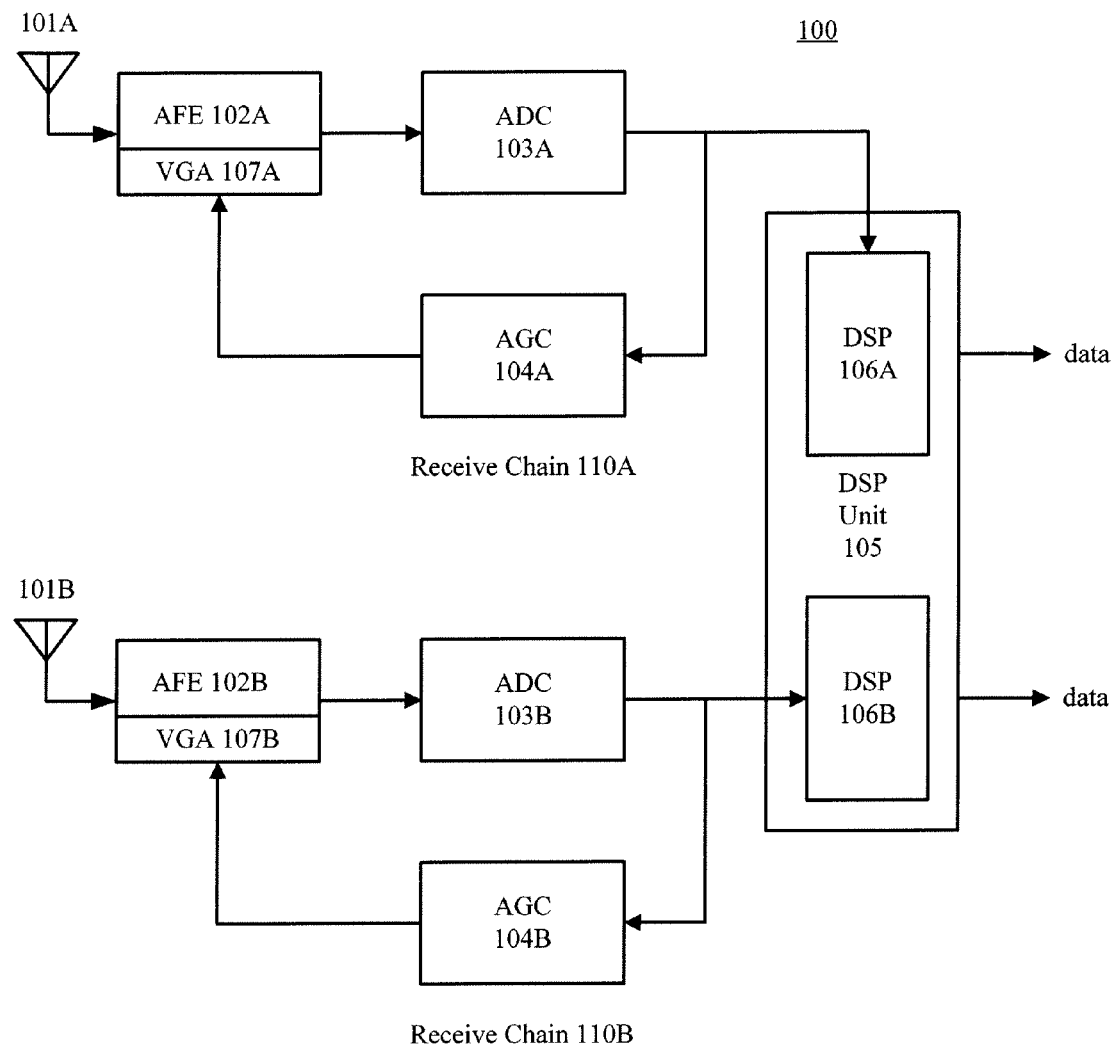
FIG. 1 is a block diagram of a prior art MIMO receiver block.
Figure 2:
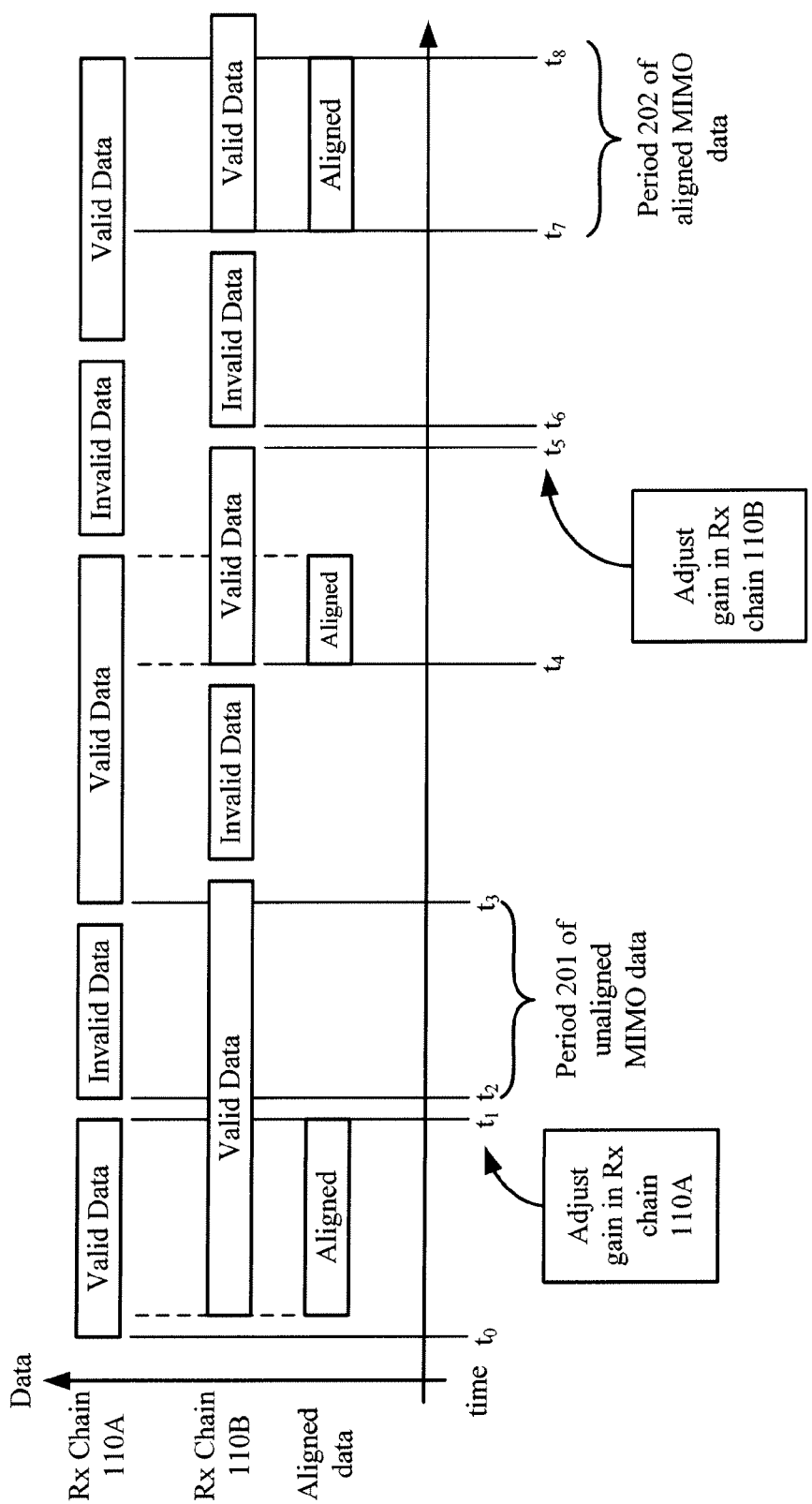
FIG. 2 is a graph illustrating an example of the output data timing relationship between the receive chains of the prior art receiver block of FIG. 1.

In the case of the prior art architecture of FIG. 1, the AGC 104A examines ADC 103A and determines that a saturation condition exists, the AGC 104A may react by reducing the gain of VGA 107A within the AFE 102A. This action may cause unaligned MIMO data as described earlier. However, circumstances that may cause receive chain 110A to be saturated, may cause receive chain 110B to exhibit saturation. Because receive chains 110A/110B of FIG. 1 act independently, the point in time at which saturation is detected may vary, thus causing each chain to act to address the saturation independently. This independent function can undesirably cause periods of unaligned MIMO data.

The architecture of MIMO receiver block 300 (FIG. 3) can advantageously address the problem of saturated receive chains. Consider an example when a very large RF signal is received by receive chain 310A. In this case, AGC 307A examines the output of ADC 303A and determines that receive chain 310A is saturated. AGC control unit 306 causes AGC 307A to reduce the gain of VGA 302A within AFE 301A. In one embodiment, the gain may be changed by a pre-determined amount. In one embodiment, the pre-determined amount may be programmed by software.

In the case when the gain change is due to saturation, AGC control unit 306 can take advantage of the fact that if one receive chain is saturated, the other receive chains may also be saturated. That is, as described above, AGC control unit 306 causes AGCs 307 to simultaneously change the gain of VGAs 302 within all receive chains 310 in MIMO receiver block 300. On the other hand, a gain change meant to address a gain increase (gain-up) or meant to adjust the signal level to accommodate the signal dynamic range (headroom) may not benefit from this technique due to the differences in the signal levels that may be present between the receive chains.

Returning to the example above, when AGC control unit 306 causes AGC 307A to reduce the gain of VGA 302A, AGC control unit 306 may also cause AGC 307B to reduce the gain of VGA 302B in a similar manner (e.g. the gain of VGA 302A and VGA 302B may both be reduced by a fixed amount). As described above, this gain reduction applies primarily to the case when the signals in the receive chain are saturated. In one embodiment, the amount of gain change applied to VGA 302A and VGA 302B may be substantially similar. In another embodiment, the amount of gain change in the VGA 302B is approximately the same as the gain change in VGA 302A plus or minus a pre-determined non-zero offset. In yet another embodiment, the gain change and the fixed amount may be programmed by software. To round out this example, in the case when a very small (weak) signal is being received, AGC control unit 306 may coordinate gain increases instead of gain reductions in VGAs 302.

Other Embodiments

In other embodiments, AGCs 307 may be configured to receive signal quality data from DSPs 304 and AFEs 301. The signal quality data may help determine whether a gain change should be applied by the AGC. For example, a power detector in an AFE 301 may provide signal strength information to an AGC 307.

Although illustrative embodiments of the invention have been described in detail herein with reference to the accompanying figures, it is to be understood that the invention is not limited to those precise embodiments. They are not intended to be exhaustive or to limit the invention to the precise forms disclosed. As such, many modifications and variations will be apparent. For example, although the above embodiments discuss a gain change being triggered simultaneously in all the receive chains, the term "simultaneously" is meant to include contemporaneous operation within a reasonable window of time. Accordingly, it is intended that the scope of the invention be defined by the Claims and their equivalents.

The invention claimed is:

1. A method for providing automatic gain control (AGC) in a multiple-input multiple-output (MIMO) receiver block including multiple receive chains, the method comprising:
   providing coordination of gain changes in the multiple receive chains of the MIMO receive block, the coordination providing only two data generation modes:
   a first data generation mode in which all receive chains in the MIMO receiver block simultaneously produce valid data; and
   a second data generation mode in which all receive chains in the MIMO receiver block simultaneously produce invalid data.

2. A method for providing automatic gain control (AGC) in a multiple-input multiple-output (MIMO) receiver block including multiple receive chains, the method comprising:
   determining a specific gain change for each receive chain; and
   when a non-zero gain change is determined for one receive chain, triggering simultaneous gain changes in the multiple receive chains using the specific gain changes,
   wherein the determining and the triggering are repeated during receipt of MIMO data,
   wherein invalid data are produced at substantially a same time on all receive chains during a settling time associated with the simultaneous gain changes.

3. The method of claim 2, wherein at least one specific gain change is zero.

4. The method of claim 2, wherein at least one specific gain change is less than a predetermined threshold set for the non-zero gain change.

5. The method of claim 4, wherein the predetermined threshold is programmed.

6. The method of claim 2, wherein an amount of gain change in a receive chain other than the one receive chain is approximately the same as a gain change of the one receive chain plus/minus a predetermined non-zero offset.

7. A method for providing automatic gain control (AGC) in a multiple-input multiple-output (MIMO) receiver block including multiple receive chains, the method comprising:
   when a predetermined gain change is indicated for one receive chain in the MIMO receiver block, triggering a gain change simultaneously in all receive chains in the MIMO receiver block, wherein each receive chain is provided an individually-determined gain change, wherein the triggering is repeated during receipt of MIMO data, and wherein invalid data are produced at substantially a same time during a settling time associated with the gain change in all receive chains.

8. The method of claim 7, wherein at least one individually-determined gain change is zero.

9. The method of claim 7, wherein at least one individually-determined gain change is less than a predetermined threshold.

10. The method of claim 9, wherein the predetermined threshold is a programmed threshold.

11. The method of claim 7, wherein an amount of gain change in a receive chain other than the one receive chain is approximately the same as a gain change of the one receive chain plus/minus a pre-determined non-zero offset.

12. A multiple-input multiple-output (MIMO) receiver block comprising:
    multiple receive chains, each receive chain including:
        an analog front end (AFE) for transforming a received RF signal into a baseband signal, the AFE including a variable gain amplifier (VGA);
        an analog-to-digital converter (ADC) for converting the baseband signal into a digital signal;
        a digital signal processing (DSP) block for performing signal processing of the digital signal;
        an automatic gain controller (AGC) for monitoring the digital signal, determining a gain change in response to the monitoring, and providing the gain change to the VGA; and
    an AGC control unit for providing coordination of gain changes in the multiple receive chains, the coordination providing only two data generation modes: a first data generation mode in which the multiple receive chains simultaneously produce valid data and a second data generation mode in which the multiple receive chains simultaneously produce invalid data.

13. The MIMO receiver block of claim 12, wherein the AFE further provides signal quality data to the AGC.

14. The MIMO receiver block of claim 12, wherein the DSP block further provides signal quality data to the AGC.

15. A multiple-input multiple-output (MIMO) receiver block comprising:
    multiple receive chains, each receive chain including:
        an analog front end (AFE) for transforming a received RF signal into a baseband signal, the AFE including a variable gain amplifier (VGA);
        an analog-to-digital converter (ADC) for converting the baseband signal into a digital signal;
        a digital signal processing (DSP) block for performing signal processing of the digital signal;
        an automatic gain controller (AGC) for monitoring the digital signal, determining a gain change in response to the monitoring, and providing the gain change to the VGA; and
    an AGC control unit for determining a specific gain change for each receive chain, and when a non-zero gain change is determined for one receive chain, triggering simultaneous gain changes in the multiple receive chains using the specific gain changes, wherein the triggering is repeated during receipt of MIMO data, and wherein invalid data are produced at substantially a same time on all receive chains during a settling time associated with the simultaneous gain changes.

16. The MIMO receiver block of claim 15, wherein at least one specific gain change is zero.

17. The MIMO receiver block of claim 15, wherein at least one specific gain change is less than a predetermined threshold.

18. The MIMO receiver block of claim 15, wherein the predetermined threshold is a programmed threshold.

19. The MIMO receiver block of claim 15, wherein the AFE further provides signal quality data to the AGC.

20. The MIMO receiver block of claim 15, wherein the DSP block further provides signal quality data to the AGC.

* * * * *